United States Patent
Hooper et al.

(10) Patent No.: US 10,892,229 B2
(45) Date of Patent: Jan. 12, 2021

(54) MEDIA SHIELD WITH EMI CAPABILITY FOR PRESSURE SENSOR

(71) Applicant: NXP USA, Inc., Austin, TX (US)

(72) Inventors: Stephen Ryan Hooper, Mesa, AZ (US); Dwight Lee Daniels, Phoenix, AZ (US); Thomas Cobb Speight, Chandler, AZ (US); Gary Carl Johnson, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/376,404

(22) Filed: Apr. 5, 2019

(65) Prior Publication Data

US 2020/0321286 A1   Oct. 8, 2020

(51) Int. Cl.
| | |
|---|---|
| *H01L 23/552* | (2006.01) |
| *G01L 9/12* | (2006.01) |
| *H01L 23/495* | (2006.01) |
| *G01L 9/06* | (2006.01) |
| *H01L 21/56* | (2006.01) |
| *H01L 21/02* | (2006.01) |
| *H01L 23/00* | (2006.01) |

(52) U.S. Cl.
CPC .............. *H01L 23/552* (2013.01); *G01L 9/06* (2013.01); *G01L 9/12* (2013.01); *H01L 21/02631* (2013.01); *H01L 21/565* (2013.01); *H01L 23/4952* (2013.01); *H01L 23/562* (2013.01)

(58) Field of Classification Search
CPC . H01L 23/4952; H01L 23/552; H01L 23/562; G01L 9/06; G01L 9/12
USPC .......................................... 257/415, 417, 659
See application file for complete search history.

(56) References Cited

U.S. PATENT DOCUMENTS

| | | |
|---|---|---|
| 5,166,772 A | 11/1992 | Soldner et al. |
| 5,557,142 A | 9/1996 | Gilmore et al. |
| 5,744,827 A | 4/1998 | Jeong et al. |
| 6,725,514 B2 | 4/2004 | Moyer et al. |
| 6,740,959 B2 | 5/2004 | Alcoe et al. |
| 7,030,469 B2 | 4/2006 | Mahadevan et al. |
| 7,243,552 B2 | 7/2007 | Vas et al. |
| 7,355,289 B2 | 4/2008 | Hess et al. |
| 7,449,775 B1 | 11/2008 | Ankireddi et al. |
| 7,781,266 B2 | 8/2010 | Zhao et al. |
| 8,012,868 B1 | 9/2011 | Naval et al. |
| 8,138,584 B2 | 3/2012 | Wang et al. |
| 8,399,972 B2 | 3/2013 | Hoang et al. |
| 9,153,543 B1 | 10/2015 | Mangrum et al. |
| 9,362,209 B1 | 6/2016 | Mangrum |
| 9,523,620 B2 | 12/2016 | Otomo et al. |
| 2007/0071268 A1 | 3/2007 | Harney et al. |
| 2007/0164409 A1 | 7/2007 | Holland |
| 2008/0014678 A1 | 1/2008 | Howard et al. |
| 2008/0197485 A1 | 6/2008 | Theuss et al. |
| 2009/0184403 A1 | 7/2009 | Wang et al. |

(Continued)

*Primary Examiner* — Matthew E Warren (57) ABSTRACT

Embodiments for a packaged semiconductor device and methods of making are provided herein, where a packaged semiconductor device includes a package body having a recess in which a pressure sensor is located; a polymeric gel within the recess that vertically and laterally surrounds the pressure sensor; and a media shield including at least one metal layer on a top surface of the polymeric gel, wherein the media shield and the polymeric gel are sufficiently flexible to transmit pressure to the pressure sensor.

11 Claims, 4 Drawing Sheets

(56) References Cited

U.S. PATENT DOCUMENTS

| | | |
|---|---|---|
| 2009/0282930 A1* | 11/2009 | Cheng .................... G01L 1/205 |
| | | 73/862.627 |
| 2009/0289335 A1 | 11/2009 | Camacho et al. |
| 2009/0302483 A1 | 12/2009 | Lin et al. |
| 2011/0049685 A1 | 3/2011 | Park et al. |
| 2011/0089547 A1 | 4/2011 | Holloway |
| 2012/0126378 A1 | 5/2012 | San Antonio et al. |
| 2014/0203380 A1 | 7/2014 | Theuss |
| 2015/0001646 A1 | 1/2015 | Mueller et al. |
| 2016/0130137 A1 | 5/2016 | Huang et al. |
| 2016/0172309 A1 | 6/2016 | Gong et al. |
| 2017/0025369 A1 | 1/2017 | Gulpen et al. |
| 2017/0103937 A1 | 4/2017 | Hsieh et al. |
| 2017/0278825 A1 | 9/2017 | Lakhera et al. |
| 2018/0149535 A1 | 5/2018 | Kobayashi et al. |
| 2018/0313709 A1* | 11/2018 | Chiou ................... G01L 19/141 |
| 2019/0259717 A1 | 8/2019 | Dadvand et al. |
| 2020/0055727 A1* | 2/2020 | Rajaraman ............ B81B 7/0038 |
| 2020/0131030 A1* | 4/2020 | Ngion ............... H01L 23/49582 |

* cited by examiner

MEDIA SHIELD WITH EMI CAPABILITY FOR PRESSURE SENSOR

BACKGROUND

Field

This disclosure relates generally to packaged pressure sensor devices, and more specifically, to protection of circuitry from media contamination, as well as the capability for protection of circuitry from electromagnetic interference (EMI).

Related Art

Pressure sensors are utilized in a variety of applications, such as in a tire pressure monitoring system (TPMS) for a vehicle. TPMS pressure sensors may be packaged with a radio frequency transmitter that is configured to transmit real-time tire pressure information from the pressure sensor to a main TPMS control unit, which in turn provides an indication (e.g., a warning) to a driver of the vehicle regarding the tire pressure information.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Conventional packaged pressure sensor devices may be implemented using a laminate substrate or lead frame like a QFN (quad flat no-lead). A hollow housing may be formed from mold compound around a pressure sensor on the QFN or substrate, which may be filled with gel to protect the pressure sensor. The pressure sensor is configured to measure pressure in a surrounding environment, where the gel transmits the pressure to the pressure sensor. However, exposing the gel to the environment includes exposing the gel to media, such as chemical substances that introduce contaminants to the gel, such as fuels, transmission fluid, motor oil, salt water, chlorinated water, and the like. When such media directly contacts the gel, the media can diffuse through the gel and cause corrosion and damage to electronic components in the gel.

The present disclosure provides a media shield at the interface between the gel and the surrounding environment. The media shield may be a sputtered metal layer that minimizes the area of the gel that media may directly contact, which minimizes the amount of media that may diffuse into the gel and reduces the probability of corrosion and damage to electronic components in the gel. Both the gel and the media shield should be flexible enough to transmit pressure to the pressure sensor. The media shield may also be grounded through a vertical wire bond connection, which also provides electromagnetic interference (EMI) protection of the circuitry.

Example Embodiments

Figure 1:
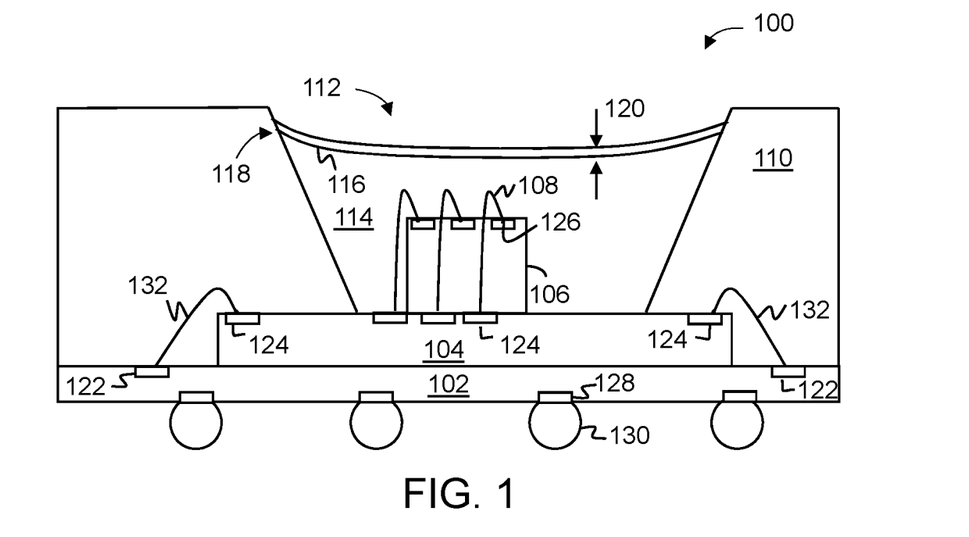
FIGS. 1 and 2 are block diagrams depicting example packaged semiconductor devices, according to some embodiments of the present disclosure.

FIG. 1 shows a cross-sectional view of an example packaged pressure sensor device 100 (also referred to as device 100), which includes a media shield. Device 100 includes a substrate 102, a semiconductor die 104, and a pressure sensor 106, with a number of interconnecting wire bond connections 108 and 132. The pressure sensor 106 is located within a cavity or recess 112 formed within a mold body 110 (also referred to as a package body 110), where the pressure sensor 106 is covered (vertically and laterally surrounded) by a polymeric gel 114. A media shield 118 is formed from a sputtered layer of metal on a top surface 116 of the polymeric gel 114. These components are further discussed below.

Figure 2:
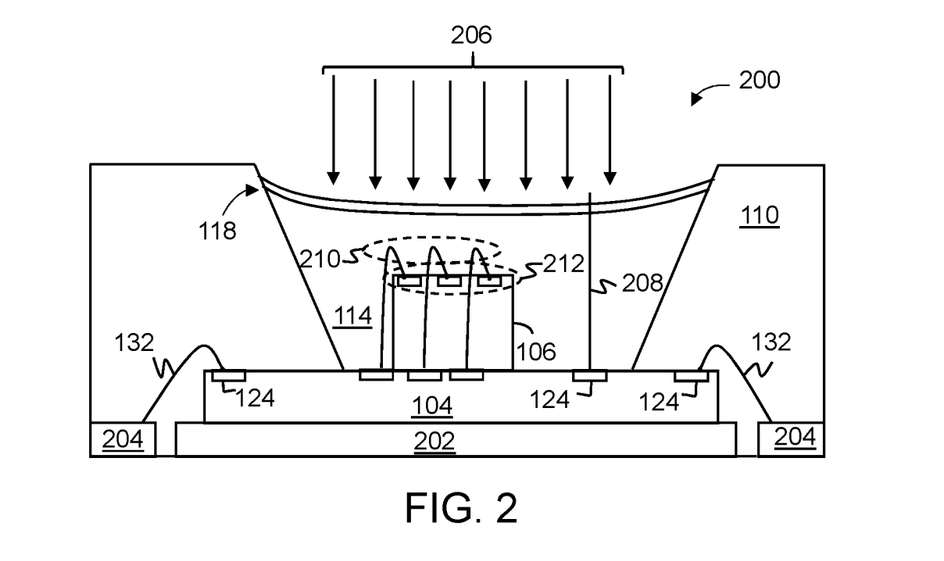

Substrate 102 provides mechanical support and electrical connections for one or more electronic components, such as die 104 and pressure sensor 106. In the embodiment shown in FIG. 1, substrate 102 is a laminate substrate, which is made of a number of dielectric layers and conductive layers to form conductive structures through the substrate, including substrate pads 122 that provide electrical connection contact surfaces on a top surface of substrate 102 (also shown as top surface 304 in FIG. 3) and substrate pads 128 for external connections 130 (e.g., solder balls) on a bottom surface of substrate 102 (also shown as bottom surface 302 in FIG. 3). In other embodiments, substrate 102 may be a lead frame having a die flag 202 and a number of leads 204 that provide electrical connection contact surfaces on one or more top surfaces of leads 204, as shown in FIG. 2. One or more bottom surfaces of leads 204 may also provide external connections. The substrate 102 in the various embodiments described herein may be either a laminate substrate or a lead frame.

Semiconductor die 104 (or simply die 104) includes active circuitry implemented on semiconductor material using a plurality of process steps (e.g., on a semiconductor wafer that is singulated into a plurality of die 104), where the remaining semiconductor material behind or underneath the active circuitry is generally referred to as bulk silicon. The active circuitry is implemented on an active side of the die 104 (also shown as active side 308 in FIG. 3) and the bulk silicon is implemented on an opposite back side of the die 104 (also shown as back side 306 in FIG. 3). The active circuitry includes interconnects to die pads 124, which provide electrical connection contact surfaces on the active side of the die 104. While the portion of the die 104 behind or underneath the active circuitry is referred to as bulk silicon, this portion (and the entire semiconductor die 104) can be any semiconductor material or combinations of materials, such as gallium arsenide, silicon germanium, silicon-on-insulator (SOI), silicon, monocrystalline silicon, the like, and combinations of the above.

Pressure sensor 106 is configured to measure pressure in an environment and output a pressure measurement signal that corresponds to a pressure reading. Pressure sensor 106 may be a MEMS (microelectromechanical structure) device implemented in semiconductor material using a plurality of process steps (e.g., on a semiconductor wafer that is singulated into a plurality of pressure sensors 106). In some embodiments, the pressure sensor is implemented as a capacitive transducer having a capacitive value that changes with pressure-induced displacement between capacitive plates within the transducer, where the transducer converts the capacitive value into the pressure measurement signal. In other embodiments, the pressure sensor is implemented as a piezo-resistive transducer having a resistive value that changes with pressure-induced strain on piezo-resistive elements within the transducer, where the transducer converts the resistive value into the pressure measurement signal. Pressure sensor 106 has at least one contact pad 126 configured to output the pressure measurement signal, which is shown on a top surface of pressure sensor 106 (also shown as top surface 312 in FIG. 5). Additional contact pads 126 are shown, which may be used for bidirectional communication. Contact pads 126 provide electrical connection contact surfaces for the pressure sensor 106.

Figure 5:
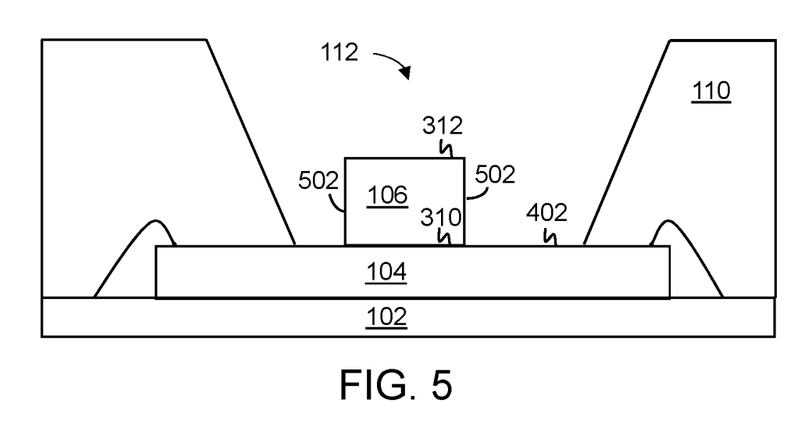

Pressure sensor 106 also has a bottom surface (shown as bottom surface 310 in FIG. 5). In the embodiments shown herein, the bottom surface of pressure sensor 106 is attached to the active side of die 104, where die 104 is in an active side up orientation (or face up orientation) and the active side of die 104 includes a sensor attachment area without any die pads 124 (e.g., a depopulated area) to which pressure sensor 106 is attached. While FIG. 1 shows three die pads 124 appearing to be "under" pressure sensor 106, such die pads are actually laterally adjacent to pressure sensor 106 for wire bond connections 108, as discussed below. In other embodiments, pressure sensor 106 may instead be directly attached to the substrate 102 (e.g., to a laminate substrate or to a die flag of a lead frame) in a similar manner as die 104 (e.g., pressure sensor 106 and die 104 are lateral to one another instead of stacked). However, attachment of pressure sensor 106 to the active side of die 104 may be preferred to achieve a smaller overall device footprint. Die attach material with adhesive properties may be used to attach the pressure sensor 106 to die 104 (or to substrate 102) and to attach the die 104 to substrate 102. Examples of die attach material include but are not limited to polymer adhesives, solder alloys, polyimides, silicone or epoxy-resin based material containing suspended filler such as carbon nanotubes, or beryllium oxide, aluminum nitride, boron nitride, or diamond powders, pastes, films, tailored die cut tapes, and the like.

Wire bond connections 132 are formed between the various electrical connection contact surfaces of substrate 102 (e.g., top surfaces of substrate pads 122 or leads 204) and die 104 (e.g., top surfaces of die pads 124), and wire bond connections 108 are formed between the various electrical connection contact surfaces of the die 104 and pressure sensor 106 (e.g., top surfaces of contact pads 126). For example, a wire bond connection 132 is formed between a die pad 124 of die 104 and a substrate pad 122 of substrate 102 (as shown on left and right sides of FIG. 1), which may be used to provide a signal connection or a power connection. Similarly, wire bond connections 132 are shown in FIG. 2 between a die pad 124 of die 104 and a lead 204 of the lead frame. As another example, a wire bond connection 108 is formed between contact pad 126 of pressure sensor 106 and a die pad 124 of die 104 (as shown in the center of FIG. 1 and FIG. 2), which provides the pressure measurement signal output by pressure sensor 106 to active circuitry of the die 104. Wire bond connections 108 are representative of a plurality of wire bond connections 108 that may be connected between the pressure sensor 106 and the die 104, including when die 104 and pressure sensor 106 are located side by side. Wire bond connections 132 are similarly representative of a plurality of wire bond connections 132 that may be connected between the substrate 102 and the die 104.

Mold body 110 is formed from an encapsulant material that provides mechanical support and protection for the device 100. Examples of encapsulant material include but are not limited to a mold compound based on a biphenyl type or multi-aromatic type epoxy resin, which may or may not include fibers or filler to provide reinforcement (e.g., glass fiber) or other beneficial aspects (e.g., thermal, physical, or electrical properties) of the mold body. Mold body 110 is generally formed over the substrate 102 and wire bond connections 132 and around the die 104, with a recess or cavity 112 present within the mold body 110 that exposes the pressure sensor 106 and any wire bond connections 108 connected to the pressure sensor 106 (e.g., any wire bond connections 108 connected between the pressure sensor 106 and the die 104). In the embodiments discussed herein, the recess 112 may be directly formed within the mold body 110 by using film assisted molding (FAM) techniques, as further discussed below in connection with FIG. 4. In order to minimize any stress or tension placed on the pressure sensor 106 that may affect the pressure measurement signal, the resulting sidewalls of the recess 112 are spaced apart from sidewalls of the pressure sensor 106 and any wire bond connections 108 connected to the pressure sensor 106 (shown as minimum lateral distance 602 in FIG. 6). Recess 112 is further discussed below in connection with FIG. 4.

Recess 112 is filled with polymeric gel 114, which covers and surrounds pressure sensor 106 and any wire bond connections 108 within the recess 112. Polymeric gel 114 has an internal crosslinked network within a liquid, where the crosslinked network may result from physical bonds or chemical bonds. The amount of crosslinking determines the viscosity of the polymeric gel 114, where the polymeric gel 114 may be injected into the recess 112 in a low viscosity form (which is also referred to as an uncured form, a low crosslinked form, or a liquid form) and cured into a high viscosity form (also referred to as a cured form, a high crosslinked form, or a gel form), as further discussed below in connection with FIGS. 7 and 8. As the viscosity of the gel 114 increases during the curing process, the density of the gel 114 also increases (e.g., the volume of the gel 114 decreases). Once cured, polymeric gel 114 has a low modulus (e.g., less than 1 mega Pascal), which allows the gel 114 to be deformed elastically or non-permanently by pressure from the environment and is flexible enough to transmit pressure from the environment to the pressure sensor 106. Examples of polymeric gel 114 include but are not limited to a polydimethylsiloxane (e.g., silicone) or other silicone based gel, such as a fluorosilicone gel.

Media shield 118 is a conformal metal layer on the top surface 116 of polymeric gel 114. Media shield 118 has thickness 120, which is thick enough to prevent media from permeating through the media shield 118, while also being thin enough to flex with the polymeric gel 114 in order for the pressure from the environment to transmit through the media shield 118 to the polymeric gel 114. For example, the media shield 118 may be in a range of 1 to 5 microns thick. Formation of the media shield 118 is further discussed below in connection with FIG. 9.

In the embodiment shown in FIG. 1, media shield 118 is electrically floating. In other embodiments, media shield 118 may be grounded, which provides the benefit of electromagnetic interference (EMI) shielding for electronic components within recess 112. FIG. 2 shows a device 200 that also includes a ground connection 208, which is a wire bond attached to a ground die pad 124 and extends vertically within recess 112, contacting media shield 118. In some embodiments, the target range of operation for a packaged pressure sensor device that includes the media shield 118 may be in a low range, such as atmospheric pressure plus or minus 5 kPa (kilopascal), or an intermediate range such as 300 to 1000 kPa for TPMS applications. While greater pressures may be measured by the disclosed packaged pressure sensor, excessive pressure swings (e.g., up to 1500 kPa for some applications) may cause excessive flexion of the media shield 118, which may fatigue the junction between the media shield 118 and the ground connection 208. However, the media shield 118 continues to provide media protection, even if the ground connection 208 no longer makes contact with the shield 118. Formation of the ground connection 208 is further discussed below in connection with FIG. 6. Another embodiment of ground connection 208 involving a looped wire bond connection is further discussed below in connection with FIG. 10.

Device 200 is also implemented with a lead frame as substrate 102, which includes a die flag 202 and leads 204. A representative configuration of the lead frame is shown in FIG. 2, while other embodiments may include differently configured lead frames, such as where the leads 204 may extend past the lateral perimeter of mold body 110, or the die flag 108 may be positioned in a different plane than the leads 204, or the die flag 108 may be covered by mold body 110. Device 200 similarly includes die 104, pressure sensor 106, wire bond connections 108 and 132, mold body 110, recess 112, gel 114, and protection layer 120, as discussed above.

FIG. 2 also shows example paths of possible media exposure. As noted above, the pressure sensor 106 of the packaged pressure sensor device 200 is configured to measure pressure in an environment, where the top surface 116 of gel 114 is exposed to the environment and transmits pressure from the environment to the pressure sensor 106. Without media shield 118, such environmental exposure would also allow media exposure to the gel 114. Media may be any chemical substance that may cause corrosion or damage to the device. Examples of media include but are not limited to fuels, transmission fluid, motor oil, salt water, chlorinated water, soapy water, acidic liquids, and the like. When such media directly contacts the exposed surface 116 of gel 114, the media can diffuse through the gel 114 and expose electronic components within the gel 114 to contaminants that may cause corrosion and damage. Electronic components closest to the surface 116 of gel 114 are at greater risk for such media exposure. Some example risk areas are indicated by dashed lines, such as an upper portion 210 of any wire bond connection 108 within the gel 114, and an upper portion 212 of the pressure sensor 106.

Generally, media shield 118 reduces the exposed portions of surface 116 of gel 114 through which media may diffuse, which reduces the amount of media that may contact and diffuse into gel 114 and ultimately reach risk areas 210 and 212. Media exposure to device 200 is represented by arrows 206. In the example shown, media is blocked or at least redirected away from surface 116 of gel 114 by media shield 118. Exposure to media 206 is greatly reduced as compared to a device without a media shield 118, which would otherwise be exposed to the entirety of media 206. By minimizing the amount of media that contacts and diffuses into gel 114, the probability of corrosion and damage occurring at risk areas 210 and 212 is reduced.

It is noted that the embodiments discussed herein implement various example electronic components, while additional electronic components may also be included in other embodiments. In some embodiments, device 100 or 200 may further include a temperature sensor for additional readings used to calibrate the pressure readings, a gyroscope sensor for additional sensor data, or an antenna used to communicate data to another device. A separate power source such as a battery (not shown) may be included in some embodiments to power the packaged semiconductor device 100 or 200.

The active circuitry of die 104 may include signal processing circuitry that is configured to receive and calibrate the pressure measurement signal in order to output accurate pressure readings. For example, signal processing circuitry may include linearization circuitry configured to improve linearity in the pressure measurement signal, temperature correction circuitry configured to adjust the pressure measurement signal (e.g., when pressure is temperature dependent), or additional circuitry with configurable settings (e.g., configurable gain for a signal amplifier or configurable monitoring thresholds for a signal monitor) to further adjust the pressure measurement signal to output accurate pressure readings. In some embodiments, the pressure readings may be output at an external connection 130.

In some embodiments, the active circuitry of die 104 may include a radio frequency (RF) block that implements an RF transmitter, where an antenna on the device 100 is configured to transmit sensor data, including pressure readings, to a main control unit. For example, the device 100 and the main control unit may be implemented in a tire pressure monitoring system (TPMS) for a vehicle, where pressure sensor 106 is used to monitor tire pressure of a given tire on the vehicle. The sensor data received by the TPMS main control unit may be used by a vehicle control system, such as a driver assistance system, to provide information or warnings to the driver (e.g., low tire pressure warning). In some embodiments, the sensor data transmitted to the main control unit also includes temperature readings or additional data. In some embodiments, sensor data may also include a unique identifier or serial number of the pressure sensor 106, which may be associated with a location of the pressure sensor 106 (e.g., a particular tire on a vehicle).

In some embodiments, the RF block may also implement an RF receiver, providing transceiver functionality for bidirectional communication between the RF block and the main control unit. The RF block implements front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front end components of the RF block may have configurable settings to adjust the output signal that conveys the sensor data. In some embodiments, the RF block may have an operating frequency that falls within a frequency band of 300 to 500 MHz, although other operating frequencies that fall within other radio frequencies may be implemented in other embodiments.

The active circuitry may further implement control logic configured to control the signal processing and RF block.

For example, control logic may adjust the configurable settings of the signal processing circuitry, the RF block, or both to achieve accurate pressure readings. In embodiments where the RF block implements an RF receiver, the control logic may receive information from the main control unit that is used to control the configurable settings of the signal processing circuitry, RF block, or both.

Figure 8:
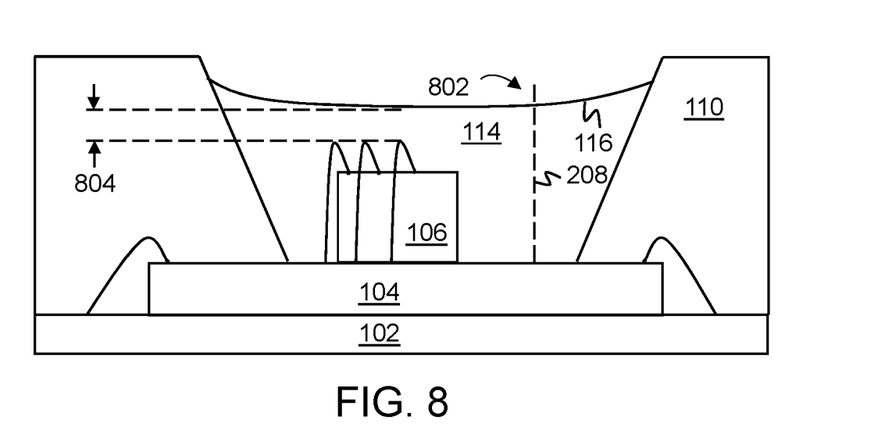
Figure 9:
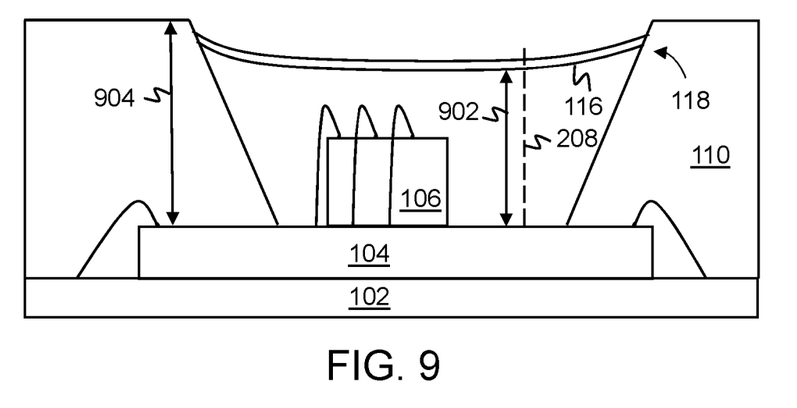
Figure 10:
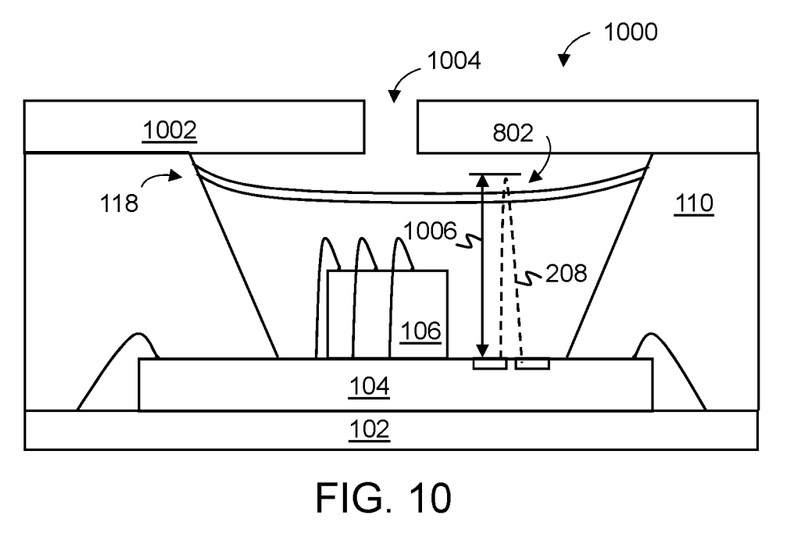
FIG. 10 is a block diagram depicting another example packaged semiconductor device, according to some embodiments of the present disclosure.

FIG. 3-9 show cross-sectional views of various steps of an example method performed on a device structure to fabricate a packaged pressure sensor device, with FIG. 10 showing another device embodiment that may be implemented in either of the above embodiments (e.g., with or without ground connection 208). The intermediate device structures shown in the following figures include the components discussed above, which are representative of components that may be included in different device embodiments, which may have a component layout that differs from that shown in the following figures. In some embodiments, the device structure is implemented in a 9 mm by 9 mm footprint, which may be differently sized in other embodiments. The single device structure shown in the following figures may be representative of a number of device structures formed as part of an array or reconstituted wafer of device structures that are then singulated into a plurality of packaged devices, where the various steps discussed herein are implemented on all device structures of the array. Pads have also been omitted from the following figures for simplicity's sake.

Figure 3:
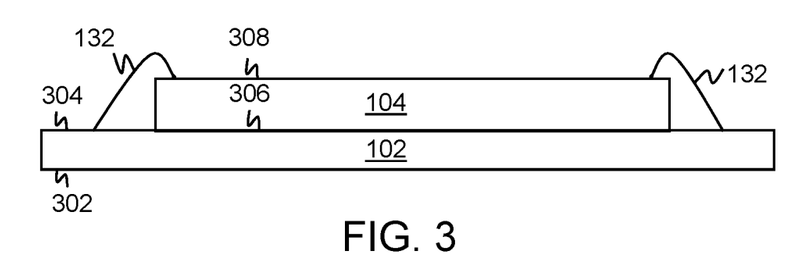
FIGS. 3, 4, 5, 6, 7, 8, and 9 are block diagrams depicting steps of an example process for fabricating a packaged semiconductor device, according to some embodiments of the present disclosure.

FIG. 3 shows an example device structure after an assembly step and wire bonding step. In the embodiment shown, the back side 306 of die 104 is attached to the top surface 304 of substrate 102 (e.g., to a laminate substrate or to a die flag of a lead frame). The active side 308 of die 104 includes a plurality of die pads 124, which are located outside of a depopulated area (e.g., an area without die pads 124) that serves as a pressure sensor attachment area, further discussed below in connection with FIG. 5. Die pads 124 may be arranged in a layout on active side 308 that implements one or more regular patterns, such as rows, or one or more irregular patterns, or both. Wire bond connections 108 are formed between die pads 124 of the die 104 and substrate pads 122 (which may be leads 204 in other embodiments).

Figure 4:
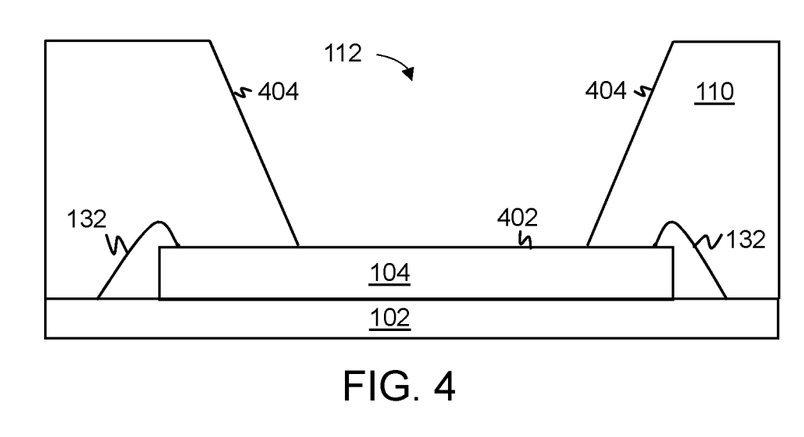

FIG. 4 shows the device structure after an encapsulation step that forms mold body 110 over the substrate 102 and around a portion of die 104. In the embodiment shown, recess 112 is formed concurrently with the mold body 110 by using a FAM technique. For example, the device structure is placed in a mold chase, and a plunger member positions a film in place on the pressure sensor assembly area (within which the pressure sensor 106 will later be placed). In the embodiment shown, pressure sensor assembly area 402 is located on the active side 308 of die 104 and includes both a depopulated area for attachment of the pressure sensor 106 and a populated area that includes die pads 124 on which wire bond connections 108 will be formed. In other embodiments, pressure sensor assembly area 402 may be located on a top surface 304 of the substrate 102 (e.g., on a laminate substrate or on a die flag of a lead frame). In embodiments where pressure sensor 106 is to be placed directly on substrate 102, the pressure sensor assembly area 402 also includes a portion of the active side of die 104 that includes die pads 124 on which wire bond connections 108 will be formed.

The plunger is large enough to encompass pressure sensor assembly area 402. Area 402 serves as a footprint in which the pressure sensor 106, any wire bond connections 108, and any ground connections 208 (if present) are attached or formed, as further discussed below. The plunger member holds the film in contact with the active side 308 of the die 104, where the film also extends upward within the mold chase, forming boundaries for side walls 404 of the recess 112. As mold compound is injected or otherwise introduced into the mold chase, the film acts a barrier preventing any mold compound from reaching the volume above area 402. The mold compound is then cured or otherwise set to form mold body 110, and the plunger member and film is removed from the resulting recess 112. Once the plunger member is removed, area 402 is exposed within recess 112. For example, in the embodiment shown, area 402 outlines an exposed portion of active side 308, which serves as an attachment surface for pressure sensor 106 and wire bond connections 108 (and 208, if present). In embodiments where pressure sensor 106 is to be placed directly on substrate 102, area 402 outlines an exposed portion of the top side 304 of substrate 102 (e.g., a top side of a laminate substrate or a die flag 202 of a lead frame) that serves as an attachment surface for pressure sensor 106 and wire bond connections 108 (and 208, if present).

Also in the embodiment shown, the recess side walls 404 are formed at a positive angle (e.g., angling outward from the center of the recess 112), but may also be formed as vertical side walls in other embodiments. Area 402 is also large enough to ensure a minimum lateral distance 602 will be achieved between the side walls 404 and any anticipated location of electrical components, such as the pressure sensor 106 or any wire bond connections 108, in order to minimize any exposure of the pressure sensor 106 to stress or tension from the rigid mold compound that would otherwise affect the pressure measurement signal of the pressure sensor 106. Minimum lateral distance 602 may also be achieved between the side walls 404 and the ground connection 208 (if present) to minimize any stress or tension from the rigid mold compound placed on the ground connection 208.

FIG. 5 shows the device structure after another assembly step that attaches the pressure sensor 106 to the attachment surface exposed within recess 112. In the embodiment shown, the bottom surface 310 of pressure sensor 106 is attached to the exposed portion of active side 308 of die 104, such as within a depopulated area of active side 308 within area 402. In other embodiments, the bottom surface 310 of pressure sensor 106 may instead be directly attached to an exposed portion of the top surface 304 of the substrate 102 (e.g., to a laminate substrate or to a die flag of a lead frame) in a similar manner as die 104 (e.g., pressure sensor 106 and die 104 are lateral to one another instead of stacked). In still other embodiments, the pressure sensor 106 may be formed as a flip-chip type of sensor, where the bottom surface 310 is an active side of the pressure sensor 106 with one or more contact pads 126 that may be attached via bumps or pillars to die pads 124 on the active side 308 of semiconductor die 104, eliminating the need for wire bond connections 108 formed between the pressure sensor 106 and the semiconductor die 104. Generally, pressure sensor 106 has a footprint that is smaller than the footprint of the underlying die 104, and may be attached at any suitable location (or pressure sensor attachment area) on the die 104.

Figure 6:
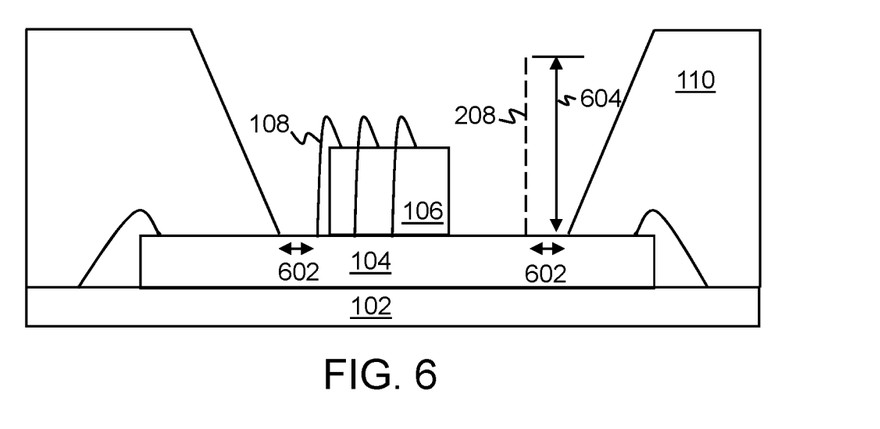

FIG. 6 shows the device structure after another wire bonding step. Wire bond connections 108 are formed between contact pads 126 of the pressure sensor 106 and die pads 124 of the die 104, which are exposed within recess 112. Minimum lateral distance 602 is achieved between recess side walls 404 and any electrical components within recess 112, such as the pressure sensor 106 (e.g., side walls 502 of pressure sensor 106), any wire bond connections 108, and any ground connections 208.

In embodiments that include a ground connection 208 (shown in dashed outline), the wire bonding step also includes forming ground connection 208 on a ground die pad 124. Ground connection 208 may be referred to as a "hanging" wire bond connection, where one end of the wire bond connection is attached to the ground die pad 124 and the other end of the wire bond connection extends upward and is terminated in the air above the ground die pad 124, forming a vertical wire bond connection. Ground connection 208 has a length or height 604 that is measured from the active side 308 of the die 104 to the end of the ground connection 208 in the air, which is long enough to ensure the ground connection 208 contacts a portion of the media shield 118, once the media shield 118 is formed. For example, the ground connection 208 may have a length 604 that is greater than the expected height of the media shield 118 (shown as height 902 in FIG. 9) in order to ensure contact between the ground connection 208 and the media shield 118. Another embodiment of ground connection 208 is shown in FIG. 10 as a tall looped wire bond connection, which may provide additional stability to the ground connection 208 during the following device fabrication steps. Example metals used for ground connection 208 include but are not limited to gold, copper, aluminum, and any combination thereof, which may include alloys or any combination of layers of different metals. While one ground connection 208 is shown herein, ground connection 208 is representative of multiple ground connections 208 that may be implemented in other embodiments.

Figure 7:
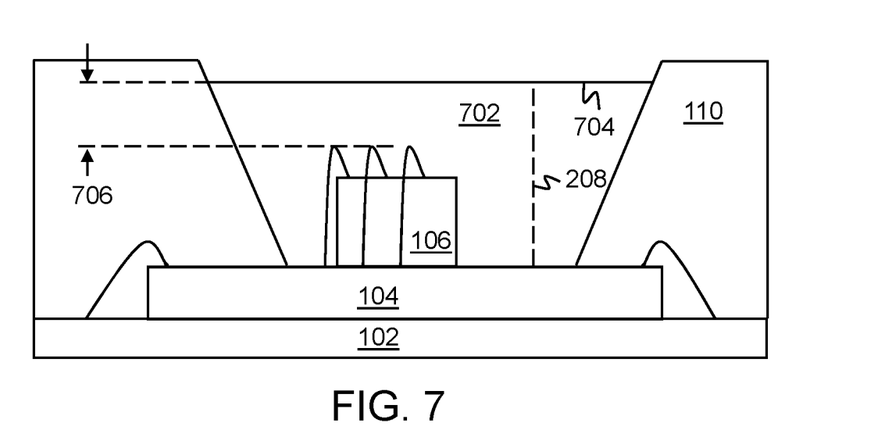

FIG. 7 shows the device structure after a low viscosity form 702 of polymeric gel 114 (also referred to as low viscosity polymeric gel 702 or low viscosity gel 702) is injected or otherwise introduced into the recess 112. The top surface 704 of gel 702 is spaced apart from any electrical components within recess 112, such as wire bond connections 108 or the top surface of pressure sensor 106, by some distance 706 in which a minimum vertical spacing 804 will be achieved, as also further described below in FIG. 8. In embodiments that include at least one ground connection 208, the low viscosity gel 702 may cover the ground connection 208 completely or may cover the majority of the ground connection 208.

FIG. 8 shows the device structure after curing the low viscosity gel 702 into the high viscosity form of polymeric gel 114 (also referred to as high viscosity polymeric gel 114 or high viscosity gel 114). During curing, the viscosity of the gel 702 increases as additional crosslinks are formed. As a result of the curing, top surface 116 may be slightly curved (e.g., in a concave manner). In some embodiments, a top portion 802 of ground connection 208 may be exposed through the top surface 116 of gel 114 after curing, due to reduction of the gel volume during curing. Generally, a minimum vertical distance 804 is achieved between the media shield 118 (e.g., measured from the bottom of the media shield 118 formed on surface 116 of the gel 114) and any electrical components (other than the ground connection(s) 208, if present) within the recess 112, avoiding electrical shorts.

FIG. 9 shows the device structure after sputtering forms the media shield 118. Media shield 118 is formed from a metal layer conformally sputtered laterally across the entirety of the top surface 116 of the polymeric gel 114. Sputtering achieves a uniform deposition across the polymeric gel 114, preventing pores or openings from forming through the media shield 118. In some embodiments, sputtering may be performed across the entirety of a top surface of the device structure, including over a top inner surface of side walls of recess 112 and over a top surface of mold body 110. Sputtering is performed at room temperature, which may be roughly in the middle of temperature operating range for a packaged pressure sensor device. The metal layer is thick enough to provide media protection, while being thin enough to transmit pressure from the environment to the gel 114. In embodiments that include at least one ground connection 208, the metal is also sputtered over the exposed portion 802 of ground connection 208, making an electrical connection from the media shield 118 to a ground die pad 124 through ground connection 208. Examples of the metal used for sputtering include but are not limited to stainless steel, copper, aluminum, other suitable metals, and any combination thereof, which may include alloys or any combination of layers of different metals. For example, media shield 118 may include a first layer of stainless steel sputtered over the entirety of the gel 114, a second layer of copper sputtered over the entirety of the first layer of stainless steel, and a third layer of stainless steel sputtered over the entirety of the copper layer. Media shield 118 is formed at a height 902, measured from active side 308 of the die 104 to the bottom of media shield 118 (which is formed on the top surface 116 of gel 114). In embodiments that include at least one ground connection 208, it may be preferred that the ground connection 208 remain within the recess 112. In other words, the length 604 of ground connection 208 may be equal to or less than a height 904 of the mold body 110 measured from the active side 308 of the die 104 to a top surface of mold body 110. The upper portion 802 of ground connection 208 may continue to protrude above the media shield 118 after sputtering.

FIG. 10 shows a device 1000, which may be implemented using either a laminate substrate or a lead frame. In the embodiment shown, substrate 102 is a laminate substrate. Device 1000 includes media shield 118 formed on gel 114, and may also include ground connection 208, as discussed above. Device 1000 also includes a lid 1002 or other protective structure attached to the top surface of mold body 110. Lid 1002 includes a vent hole or an aperture 1004 through which pressure of the environment is exposed to the media shield 118, which in turn is transmitted to pressure sensor 106 through gel 114. The device structure shown in FIG. 10 may be an individual device or may be a representative device of an array or panel of devices, which may be formed using a laminate substrate or a lead frame array.

FIG. 10 also shows another embodiment of ground connection 208, as a looped wire bond connection. Such a ground connection 208 is formed with one end of a wire bond connection attached to a first ground die pad 124 and the other end attached to a second ground die pad 124 within area 402, with the apex (or peak of the looped wire bond connection) reaching a height 1006 equal to or greater than the height 902 of the media shield 118. In the embodiment shown, the apex of ground connection 208 extends to a height 1006 greater than the media shield 118 to ensure ground connection 208 makes contact with media shield 118, leaving a portion 802 exposed above the media shield 118. Also, the ground die pads 124 need not be as closely spaced as those shown in FIG. 10. For example, in one embodiment, the ground die pads 124 may be located on different sides of die 104 within recess 112. A looped wire bond connection may provide additional mechanical stability for ground connection 208 during fabrication steps that would induce movement in ground connection 208. For example, the looped configuration of ground connection 208 may be able to better withstand any lateral movement introduced by injection of gel 702 into recess 112, which prevents misalignment of ground connection 208, such as a "leaning" ground connection 208 having a shorter height 604 that fails to contact media shield 118. However, it is noted that even if ground connection 208 fails to contact media shield 118, media shield 118 continues to provide media protection.

A laminate substrate is made of a number of dielectric layers and conductive layers to form conductive structures through the substrate, which include plating, pads (e.g., pads 122), interconnects, and vias. Such conductive structures are formed from an electrically conductive material, examples of which include but are not limited to nickel, gold, copper, aluminum, or other suitable conductive metal or alloy composed of one or more suitable conductive metals. Electrical connection contact surfaces on the substrate pads may be coated with an electrically conductive material, examples of which include nickel, gold, copper, aluminum, tin, silver, titanium, or other suitable conductive metal or alloy composed of one or more suitable conductive metals in order to improve the "bondable" nature of the substrate pads. Examples of a laminate substrate include, but are not limited to, a ball grid array (BGA), a pin grid array (PGA), and the like. The laminate substrate shown in FIG. 1 may be an individual substrate, or may be a representative substrate in a substrate array or panel that includes a plurality of laminate substrates.

A lead frame is formed from electrically conductive material, examples of which include but are not limited to copper, nickel, or other suitable conductive materials or alloy composed of one or more suitable conductive materials. Electrical connection contact surfaces (and external connections) on the leads may also be coated with an electrically conductive material, examples of which include but are not limited to nickel, gold, copper, aluminum, tin, or other suitable conductive metal or alloy composed of one or more suitable conductive materials in order to improve the "bondable" nature of the leads. The lead frame shown in FIG. 2A may be an individual lead frame, or may be a representative lead frame in a lead frame array that includes a plurality of lead frames.

Semiconductor die 104 (also referred to as simply die 104) may be formed as one of a plurality of die implemented on a semiconductor wafer, which can be implemented using any semiconductor material or combinations of materials, such as gallium arsenide, silicon germanium, silicon-on-insulator (SOI), silicon, monocrystalline silicon, the like, and combinations of the above. The active circuitry of semiconductor die 104 is formed using a sequence of numerous process steps applied to the semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device. In some embodiments, the active circuitry includes an LDMOS (laterally diffused metal oxide semiconductor) transistor.

By now it should be appreciated that there has been provided a media shield including at least one metal layer directly sputtered onto a top surface of a polymeric gel to provide a barrier to media at the interface between the gel and the surrounding environment, where the media shield may be connected to ground to further provide EMI shielding.

In one embodiment of the present disclosure, a packaged semiconductor device is provided, which includes: a package body having a recess in which a pressure sensor is located; a polymeric gel within the recess that vertically and laterally surrounds the pressure sensor; and a media shield including at least one metal layer on a top surface of the polymeric gel, wherein the media shield and the polymeric gel are sufficiently flexible to transmit pressure to the pressure sensor.

One aspect of the above embodiment provides that the recess has one or more recess sidewalls, and each recess sidewall is separated from an adjacent electronic component located within the recess by at least a minimum lateral spacing distance.

Another aspect of the above embodiment provides that the media shield is separated from an adjacent electronic component located within the recess by at least a minimum vertical spacing distance.

Another aspect of the above embodiment provides that the media shield laterally extends across an entirety of a top surface of the polymeric gel.

Another aspect of the above embodiment provides that the media shield has a thickness of 5 microns or less.

Another aspect of the above embodiment provides that the media shield includes a first stainless steel layer, a copper layer, and a second stainless steel layer.

Another aspect of the above embodiment provides that the packaged semiconductor device further includes: a ground connection having at least one end attached to a ground pad on the die within the recess, wherein the ground connection electrically contacts the media shield.

A further aspect of the above embodiment provides that the ground connection includes a vertical wire having an upper portion that protrudes above the media shield.

Another further aspect of the above embodiment provides that the ground connection includes a looped wire having an upper portion that protrudes above the media shield.

Another aspect of the above embodiment provides that the packaged semiconductor device further includes: a substrate embedded in the package body; and a semiconductor die attached to the substrate and embedded in the package body, wherein the substrate is one of a group including a laminate substrate and a lead frame.

Another aspect of the above embodiment provides that the packaged semiconductor device further includes: a lid attached to a top surface of the package body, wherein the lid includes a vent hole.

In another embodiment of the present disclosure, a method for fabricating a packaged semiconductor device is provided, the method including: assembling a semiconductor die and a substrate as part of a device structure; encapsulating the device structure using film assisted molding to form a mold body having a recess; attaching a pressure sensor to an attachment surface exposed within the recess; injecting a low viscosity polymeric gel into the recess to vertically and laterally surround the pressure sensor; curing the low viscosity polymeric gel into a high viscosity polymeric gel; and sputtering at least one metal layer on a top surface of the high viscosity polymeric gel, wherein the at least one metal layer and the high viscosity polymeric gel are sufficiently flexible to transmit pressure to the pressure sensor.

One aspect of the above embodiment provides that the at least one metal layer is sputtered laterally across an entirety of a top surface of the polymeric gel.

Another aspect of the above embodiment provides that the sputtering includes: sputtering a first metal layer directly on the top surface of polymeric gel, sputtering a second metal layer directly on the first metal layer; and sputtering a third metal layer directly on the second metal layer.

A further aspect of the above embodiment provides that the first and third metal layers each includes stainless steel, and the second metal layer includes copper.

Another aspect of the above embodiment provides that the method further includes: prior to the encapsulating, forming a ground connection having at least one end attached to a ground pad on the die within the recess, wherein the ground connection electrically contacts the media shield.

A further aspect of the above embodiment provides that the ground connection includes a vertical wire having an upper portion that protrudes above the media shield.

Another further aspect of the above embodiment provides that the ground connection includes a looped wire having an upper portion that protrudes above the media shield.

Another further aspect of the above embodiment provides that a height of the ground connection measured from an active side of the semiconductor die is equal to or less than a height of the mold body measured from the active side of the semiconductor die.

Another aspect of the above embodiment provides that the method further includes: after the sputtering, attaching a lid to a top surface of the package body, wherein the lid includes a vent hole.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is noted that the term "neighboring" as used herein means "adjacent to" (e.g., next to and without an intervening object), and "laterally" as used herein means "in a sideways direction" (e.g., a horizontal direction that is parallel to a plane of the substrate).

Also as used herein, the terms "approximately" and "about" mean a value close to or within an acceptable range of an indicated value, amount, or quality, which also includes the exact indicated value itself.

As used herein, the terms "substantial" and "substantially" mean sufficient to achieve the stated purpose or value in a practical manner, taking into account any minor imperfections or deviations, if any, that arise from usual and expected process abnormalities that may occur during device fabrication, which are not significant for the stated purpose or value.

Although the invention is described herein with reference to specific embodiments, various modifications and changes can be made without departing from the scope of the present invention as set forth in the claims below. For example, additional or fewer electronic components may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
    a package body having a recess in which a pressure sensor is located;
    a polymeric gel within the recess that vertically and laterally surrounds the pressure sensor; and
    a media shield comprising at least one metal layer on a top surface of the polymeric gel, wherein the media shield and the polymeric gel are sufficiently flexible to transmit pressure to the pressure sensor.

2. The packaged semiconductor device of claim 1, wherein
    the recess has one or more recess sidewalls, and
    each recess sidewall is separated from an adjacent electronic component located within the recess by at least a minimum lateral spacing distance.

3. The packaged semiconductor device of claim 1, wherein
    the media shield is separated from an adjacent electronic component located within the recess by at least a minimum vertical spacing distance.

4. The packaged semiconductor device of claim 1, wherein
    the media shield laterally extends across an entirety of a top surface of the polymeric gel.

5. The packaged semiconductor device of claim 1, wherein
    the media shield has a thickness of 5 microns or less.

6. The packaged semiconductor device of claim 1, wherein
    the media shield comprises a first stainless steel layer, a copper layer, and a second stainless steel layer.

7. The packaged semiconductor device of claim 1, further comprising:

a ground connection having at least one end attached to a ground pad on the die within the recess, wherein the ground connection electrically contacts the media shield.

8. The packaged semiconductor device of claim 7, wherein
the ground connection comprises a vertical wire having an upper portion that protrudes above the media shield.

9. The packaged semiconductor device of claim 7, wherein
the ground connection comprises a looped wire having an upper portion that protrudes above the media shield.

10. The packaged semiconductor device of claim 1, further comprising:
a substrate embedded in the package body; and
a semiconductor die attached to the substrate and embedded in the package body, wherein
the substrate is one of a group including a laminate substrate and a lead frame.

11. The packaged semiconductor device of claim 1, further comprising:
a lid attached to a top surface of the package body, wherein the lid includes a vent hole.

\* \* \* \* \*